(12) United States Patent
Tiziani et al.

(10) Patent No.: US 6,593,665 B2
(45) Date of Patent: Jul. 15, 2003

(54) PROTECTIVE ENVELOPE FOR A SEMICONDUCTOR INTEGRATED CIRCUIT

(75) Inventors: Roberto Tiziani, Nerviano (IT); Marzio Terzoli, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/844,506

(22) Filed: Apr. 27, 2001

(65) Prior Publication Data

US 2002/0050630 A1 May 2, 2002

(30) Foreign Application Priority Data

Apr. 28, 2000  (IT) .......................................... MI00A0942

(51) Int. Cl.[7] .............................................. H01L 23/28
(52) U.S. Cl. ...................... 257/787; 257/667; 257/676; 257/670; 257/666; 438/124; 438/123; 438/106
(58) Field of Search ................................ 257/667, 666, 257/670, 787, 676; 438/124, 123, 106

(56) References Cited

U.S. PATENT DOCUMENTS 5,932,923 A  *  8/1999  Kim et al. ................... 257/667

FOREIGN PATENT DOCUMENTS

JP         1-268159        10/1989

* cited by examiner

Primary Examiner—Kamand Cuneo
Assistant Examiner—Luan Thai
(74) Attorney, Agent, or Firm—Lisa K. Jorgenson; Dennis M. de Guzman; Seed IP Law Group PLLC

(57) ABSTRACT

A protective envelope, made of a plastics material for enclosing a semiconductor integrated circuit, includes a flattened parallelepiped body having a sidewall formed of first and second portions set to converge toward each other. The envelope also includes a lead frame embedded in the body and bearing the integrated circuit, the lead frame having a section bent to form a baffle plate orientated toward the first sidewall portion. Advantageously, the bent section of the lead frame has a plane end edge extending parallel to the first sidewall portion at a spacing therefrom.

4 Claims, 1 Drawing Sheet

PROTECTIVE ENVELOPE FOR A SEMICONDUCTOR INTEGRATED CIRCUIT

TECHNICAL FIELD

The present invention relates to a protective envelope for a semiconductor integrated circuit borne on a lead frame of metal.

More particularly, the invention relates to a protective envelope made of a plastics material for enclosing a semiconductor integrated circuit therein, which envelope comprises a flattened parallelepiped body having a sidewall formed of first and second portions set to converge toward each other, a lead frame embedded in said body and bearing the integrated circuit, the lead frame having a section bent to form a baffle plate orientated toward the first of said sidewall portions.

This envelope is formed by injecting a resin in a molten state into a mold accommodating the lead frame of conductive material with the integrated circuit on it. The mold, usually built in two halves, is opened after curing the resin to release the finished package.

The invention further relates to a mold for use in molding said envelope.

BACKGROUND OF THE INVENTION

In the field of semiconductor (usually silicon) integrated circuits borne on a metal lead frame, there exists a growing demand for such protective envelopes to be of little bulk and capable of keeping the integrated circuit fully isolated electrically in a way that would not interfere with the heat transfer capabilities required of the envelope in order to dissipate heat generated on its interior during the circuit operation.

A silicon wafer formed with the integrated circuit is assembled with a lead frame made of a conductive material. This lead frame is operative to communicate the electric signals from the circuit to the outside world on a plurality of contact pins that are connected to respective pads on the integrated circuit, as well as to serve the heat transfer function demanded of it. The lead frame additionally serves a structural function by supporting the wafer not only during its operation, as mentioned above, but also in the course of its fabrication, as explained hereinafter.

For the circuit to operate as expected, the wafer must be kept suitably isolated from any external influence likely to alter the features of the electric signals.

For the purpose, the wafer is confined, together with the lead frame in contact with it, inside an envelope of an insulating plastics material, such as a suitable resin, which will keep all its parts isolated from the outside world but for its portion in contact with the lead frame, this portion being to dissipate heat as mentioned.

The lead frame is in the form of a conductive material foil, no less wide than the wafer, having a first surface to bear the wafer, and a second surface, the heat transfer surface, on the opposed side from the first.

Heat transfer takes place through the second surface, but this surface requires to be isolated electrically and, accordingly, is enclosed in the envelope. The insulator should not be thick enough to impair the transfer of heat, yet it is expected to provide an adequate degree of electrical isolation.

The integrated circuit industry is concerned with Microsystems, i.e., systems of a minute physical size, and this factor is at the root of the great difficulties encountered when a heat transfer surface is to be provided in still smaller size than the circuit itself.

Briefly, the heat transfer surface should be covered with a layer of insulating material that is both thin and uniform. This layer is formed from a suitable resin, the resin being injected in a molten state into a mold that accommodates the silicon wafer and part of the lead frame. The mold is opened after curing the resin.

A commonly occurring problem is that the molten resin tends to flow unevenly through the mold interior by reason of a high viscous drag opposing the penetration with resin of the shallow heat transfer gap provided between the second surface and the bottom half of the mold. This situation of uneven flow leaves regions of the heat transfer surface uncovered with resin, resulting in inferior electrical or electronic protection of the surface.

The problem has been addressed in the state of the art by Japanese Patent No. JP1268159 to NEC Corp., wherein the conductive frame is formed with a bent section jutting toward the injection hole of the mold. In this way, the inflow of molten resin undergoes a compressive action effective to overcome its viscous drag and force it to the heat transfer area. A denser and adequately thin layer of resin is thus obtained.

In this reference, the end portion of the holder inside the mold is bent through an angle of 35° to 40° from the remainder of the holder to reach a position just opposite to the injection hole of the mold.

The results obtained with this arrangement do point to this orientation providing a useful baffle plate, though not one that can yield an unfailingly uniform thin layer of resin under all the critical flow conditions met by the injected stream of resin.

Other approaches to providing integrated circuits with envelopes incorporating a thin heat transfer layer, also involve constricting the mold injection conduit in various ways, e.g., as disclosed in U.S. Pat. No. 5,793,613 and U.S. Pat. No. 5,935,502. These references, although achieving improved compression of the resin stream, are still far from ensuring a uniform distribution of the resin.

Thus, the state of the art offers no effective methods to solve the technical problem just described.

SUMMARY OF THE INVENTION

An embodiment of the present invention provides an envelope for integrated circuits with structural and functional features appropriate to electrically isolate a heat transfer surface coated with a thin resin layer and allow a transfer of heat to occur as required for proper operation of the integrated circuit.

A principle on which the present invention stands is one of using a special mold, accommodating a silicon wafer borne on a metal lead frame, to produce a fully insulative envelope that also provides for an adequate transfer of heat. This result can be achieved by facilitating the introduction of a molten resin stream into the gap between the underside of the lead frame and the inner surface of the bottom mold half, by application of a sufficient pressure to overcome the viscous drag arising from the shallowness of the gap and the flow characteristics of the resin in the molten state.

In one embodiment, the bent section of the lead frame ends in a plane edge extending parallel to said first sidewall portion at a spacing therefrom.

The features and advantages of a protective envelope according to the invention will be apparent from the following description of an embodiment thereof, given by way of non-limitative example with reference to the accompanying drawings.

DETAILED DESCRIPTION OF THE INVENTION

Figure 1:
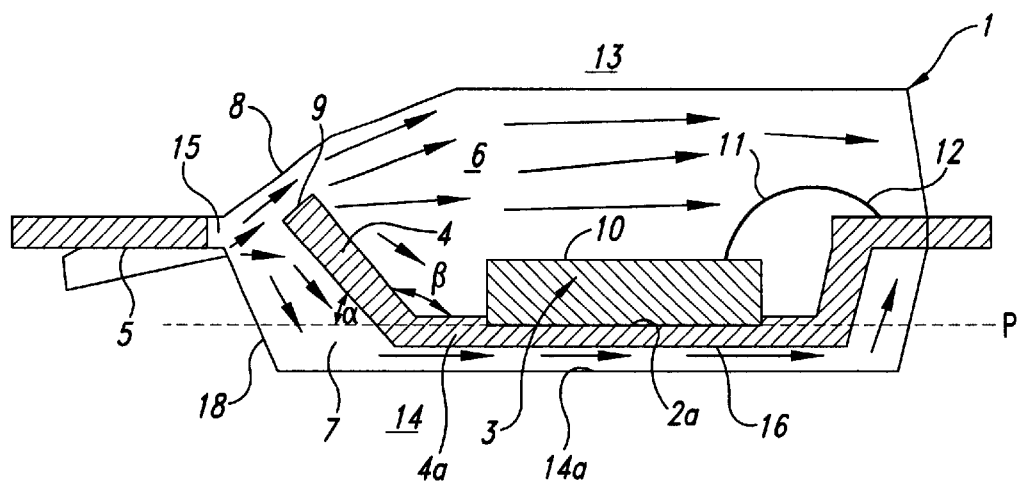
FIG. 1 shows schematically the envelope, containing the lead frame and wafer, inside a mold.

With reference to the drawings, in particular to the example of FIG. 1, there is shown schematically a protective envelope 1 for an integrated circuit 10, according to the invention.

The envelope 1 shape is substantially that of a flattened parallelepipedon having at least one sidewall resulting from converging first 8 and second 18 portions.

This envelope 1 contains lead frame 2 with a central sunk portion 2A that provides support for a wafer 3 of a semiconductor material. The sunk portion 2A of the frame 2 ideally defines a lay plane P, as explained hereinafter.

The circuit 10 has been integrated in the wafer 3 using well-known methods in microelectronics. The integrated circuit 10 is provided with peripheral contact pads connected, through wire leads 11, to the inward ends of respective pins 12. The pins 12 are formed integrally with the frame 2 and are used to communicate electric signals to and from the integrated circuit 10.

The lead frame 2 has a portion 4, close to one of its ends, which is deflected toward the top of the envelope 1, more precisely toward said first portion 8 of said sidewall. This bent portion 4 forms an acute angle α with the lay plane P of the sunk portion 2A of the frame. Preferably, this angle is about 35° to 40°. Conversely, the lead frame 2 also includes a lower base portion 4A that forms an obtuse angle β with respect to the bent portion 4.

The lead frame 2 with the wafer 3 is placed in a mold formed of two halves 13, 14 set one upon the other. The half-mold 14, taken to be the bottom one, has a substantially trapezoidal shape in cross-section and is to receive the lead frame. The other half-mold 13 has a trapezoidal outline, and will be referred to as the top one because placed on top of the half-mold 14; it defines a side hole 15 through which the resin is injected.

Inner surfaces of the half-molds 13, 14 register with the sidewall portions 8, 18, respectively, of the envelope 1 and are also convergent to the hole 15. The bottom half-mold 14 includes a top mold surface 14A that is parallel to and spaced from a lower surface 16 of the base portion 4A of the lead frame 2.

Figure 2:
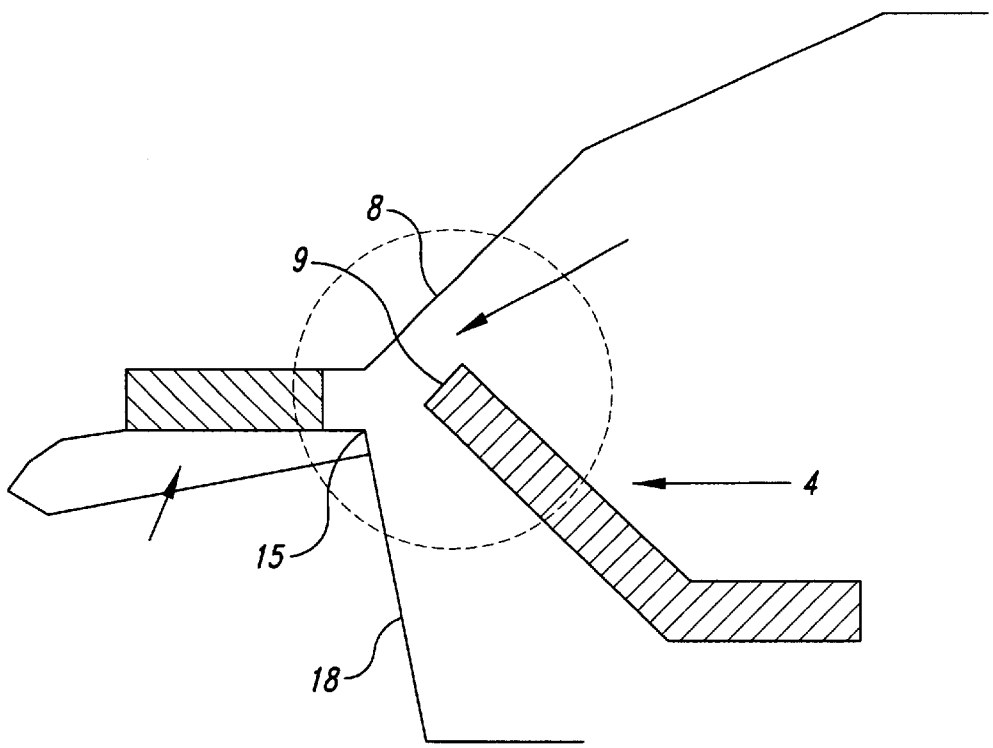
FIG. 2 is a schematic detail view of the envelope highlighting the constriction near the end of the lead frame.

To make the envelope 1, molten resin is introduced into the mold through a conduit 5 ending in the hole 15, the resin flowing along the directions indicated in FIG. 2 to the top 6 and bottom 7 portions of the envelope 1.

Given the different volumes of the two half-portions, the stream of resin will tend to fill the top portion 6, bound by the top half-mold 13, of the envelope in less time than the bottom portion 7, bound by the bottom half-mold 14, of the envelope. This results in a slower flow of resin to the heat transfer space, that is into the shallow gap between the lower surface 16 of the frame 2 and the top mold surface 14A of the bottom half 14 of the mold. Consequently, inceptive hardening of the resin in this area may prevent the gap from being duly filled up, or may leave some regions uncovered.

Advantageously, the deflected portion 4 of the lead frame 2 ends in a plane edge 9 set a predetermined distance from the first sidewall portion 8, the latter registering with a portion of the top half 13 of the mold. More particularly, the end edge 9 and the wall 8 extend parallel to each other and cooperate to define a parallel-sided constriction in the path of the molten resin that floods the envelope 1 during the injection step.

It is at this stage that the parallel-sided constriction between the edge 9 and the wall 8 proves effective to convey a larger amount of the resin to the bottom portion 7.

This takes place under sufficient pressure to overcome viscous drag through the bottom portion 7. With the lead frame portion 4 orientated as above, a lead-in is defined additionally to said constriction for the resin to flow in larger amounts to the bottom portion, thereby augmenting the pressure of the resin stream.

Eddy making in the bottom portion 7, particularly in the low interstice under the frame 2, during the injection is effectively avoided, resulting in a uniform thin coating of resin that, once cured, will provide electric protection and an adequate heat transfer capability.

FIG. 2 is a detail view of the mold portion near the hole 15, also showing a detail of the wall 8 that runs parallel to the edge 9. The arrows illustrate the effect of the end of the portion 4, which is positioned opposite and close to the hole 15 to produce the sort of compression and orientation needed to overcome viscous drag and direct a larger amount of resin to the space serving a heat transfer function under the lead frame 2.

In this way, once the resin has reached said gap without eddying, and is thoroughly cured, the mold can be opened and the electronic component used in the protected condition afforded by its envelope.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. An envelope for enclosing a semiconductor integrated circuit, the envelope comprising:

a flattened parallelepiped body having a top portion, a bottom portion, and a sidewall formed of upper and lower portions set to converge toward each other, and a lead frame embedded in said body and bearing the integrated circuit, said lead frame having a section bent to form a baffle plate orientated toward the upper of said sidewall portions, the bent section of the lead frame ends in a plane edge extending parallel to said upper sidewall portion at a predetermined distance therefrom in such a way that the plane edge and the upper sidewall portion cooperate with each other to define a parallel-sided constriction in a path of a molten resin that is to flow in the envelope, to allow conveyance of a larger amount of the resin to the bottom portion.

2. An envelope according to claim 1, wherein said lead frame is formed with a sunk portion defining a lay plane, and said bent section of the lead frame is orientated at an acute angle to said lay plane.

3. An envelope according to claim 2, wherein said acute angle is 35 to 40 degrees.

4. A mold for molding an envelope to enclose a semiconductor integrated circuit, the mold comprising:

upper and lower mold halves with the upper mold half set on top of the lower mold half to define a cavity accessed through a molten resin injection hole, the upper and lower mold halves having respective sidewalls set to converge together at said hole, and the mold accommodating a lead frame arranged to bear the integrated circuit and provided with a bent section adapted to form a baffle plate jutting toward said hole, wherein the bent section of the lead frame ends in a plane edge extending parallel to the sidewall of the upper mold half at a predetermined distance therefrom to define a parallel-sided constriction, formed by the plane edge and the sidewall of the upper mold half, in a path of a molten resin that is to flow into the mold, to allow conveyance of a larger amount of the resin to the lower mold half.

* * * * *